(12) United States Patent
Olesen et al.

(10) Patent No.: US 7,529,091 B2
(45) Date of Patent: May 5, 2009

(54) POWER SEMICONDUCTOR MODULE AND METHOD FOR COOLING A POWER SEMICONDUCTOR MODULE

(75) Inventors: Klaus Kristen Olesen, Soenderborg (DK); Ronald Eisele, Surendorf (DE)

(73) Assignee: Danfoss Silicon Power GmbH, Schleswig (DE)

( * ) Notice: Subject to any disclaimer, the term of this patent is extended or adjusted under 35 U.S.C. 154(b) by 0 days.

(21) Appl. No.: 11/597,158

(22) PCT Filed: May 24, 2005

(86) PCT No.: PCT/DK2005/000341

§ 371 (c)(1),
(2), (4) Date: Feb. 12, 2007

(87) PCT Pub. No.: WO2005/117107

PCT Pub. Date: Dec. 8, 2005

(65) Prior Publication Data

US 2007/0210445 A1    Sep. 13, 2007

(30) Foreign Application Priority Data

May 25, 2004  (DE) .................. 10 2004 026 061

(51) Int. Cl.
*H05K 7/20* (2006.01)
*H01L 23/473* (2006.01)

(52) U.S. Cl. .................. 361/701; 361/699; 361/700; 165/80.4; 165/80.5; 165/104.19; 174/16.3; 174/252

(58) Field of Classification Search .................. 361/689, 361/698–700, 701–707, 710, 714–722; 165/80.3, 165/80.4, 80.5, 104.33, 104.59, 126, 135, 165/136, 139, 146, 168, 170; 62/3.2, 3.3, 62/159.2; 257/713–715, 721, 678, 796, 789; 29/521, 557, 505, 840, 890.03, 841; 174/15.1, 174/16.3, 252
See application file for complete search history.

(56) References Cited

U.S. PATENT DOCUMENTS

| 3,405,986 | A |   | 10/1968 | Cannon ..................... 312/214 |
| 3,590,136 | A |   | 6/1971  | Kunishi et al. ............... 174/50 |
| 4,712,158 | A | * | 12/1987 | Kikuchi et al. .............. 361/699 |
| 4,901,201 | A | * | 2/1990  | Crowe ........................ 361/694 |
| 5,088,005 | A | * | 2/1992  | Ciaccio ...................... 361/699 |
| 5,238,299 | A |   | 8/1993  | McKinney ................ 312/223.6 |

(Continued)

FOREIGN PATENT DOCUMENTS

DE    198 10 571 C1    5/1999

(Continued)

*Primary Examiner*—Michael V Datskovskiy
(74) *Attorney, Agent, or Firm*—McCormick, Paulding & Huber LLP

(57) ABSTRACT

The invention relates to a power semiconductor module comprising a plurality of power semiconductors that are fixed to a first side of a printed circuit board (26), and a cooling device that acts by means of a coolant, on a second side of the printed circuit board (26), opposite the first side, the cooling device comprising a plurality of cells through which the coolant is guided. The aim of the invention is to minimise the risk of failure of one such power semiconductor module. To this end, a non-cooled region (d, e, f) is arranged between at least two cells.

16 Claims, 4 Drawing Sheets

U.S. PATENT DOCUMENTS

| | | | | |
|---|---|---|---|---|
| 5,243,130 | A | 9/1993 | Kitagawa | 174/50 |
| 5,381,598 | A | 1/1995 | Adachi et al. | 29/845 |
| 5,835,345 | A * | 11/1998 | Staskus et al. | 361/699 |
| 5,929,518 | A * | 7/1999 | Schlaiss | 257/712 |
| 5,978,220 | A | 11/1999 | Frey et al. | 361/699 |
| 5,983,997 | A * | 11/1999 | Hou | 165/144 |
| 5,985,189 | A | 11/1999 | Lynn et al. | 264/46.5 |
| 5,998,240 | A * | 12/1999 | Hamilton et al. | 438/122 |
| 6,038,126 | A | 3/2000 | Weng | 361/679 |
| 6,388,317 | B1 | 5/2002 | Reese | 257/713 |
| 6,591,625 | B1 * | 7/2003 | Simon | 62/259.2 |
| 6,729,383 | B1 * | 5/2004 | Cannell et al. | 165/80.3 |
| 6,989,991 | B2 * | 1/2006 | Barson et al. | 361/699 |
| 7,110,258 | B2 * | 9/2006 | Ding et al. | 361/699 |
| 7,190,581 | B1 * | 3/2007 | Hassani et al. | 361/699 |
| 7,277,284 | B2 * | 10/2007 | Lee et al. | 361/699 |
| 7,339,788 | B2 * | 3/2008 | Olesen et al. | 361/699 |

FOREIGN PATENT DOCUMENTS

| | | | |
|---|---|---|---|
| DE | 010038178 A1 * | 2/2002 | |
| EP | 1 075 169 A1 | 2/2001 | |
| FR | 2 609 268 | 7/1988 | |
| JP | 4-257684 | 9/1992 | |
| JP | 411340394 A * | 12/1999 | |
| JP | 02003258176 A * | 9/2003 | |
| JP | 2004022973 A * | 1/2004 | |
| JP | 2004-36924 | 2/2004 | |
| WO | 03/095922 A2 | 11/2003 | |

* cited by examiner

POWER SEMICONDUCTOR MODULE AND METHOD FOR COOLING A POWER SEMICONDUCTOR MODULE

CROSS REFERENCE TO RELATED APPLICATIONS

This application is entitled to the benefit of and incorporates by reference essential subject matter disclosed in International Patent Application No. PCT/DK2005/000341 filed on May 24, 2005 and German Patent Application No. 10 2004 026 061.3 filed May 25, 2004.

FIELD OF THE INVENTION

The invention concerns a power semiconductor module with several power semiconductors which are fastened onto a first side of a circuit board, and a cooling device which is on a second side of the circuit board lying oppositely to the first side and which operates with a cooling agent, with the cooling device having several cells through which the cooling agent is guided. Further, the invention concerns a method for cooling a semiconductor module having several power semiconductors on a first side of a circuit board, in which method a cooling agent operates on a second side of the circuit board opposite to the first side of the circuit board.

BACKGROUND OF THE INVENTION

A power semiconductor module and a method of the previously mentioned kind are known from WO 03/095922 A2. The cooling device has a housing which is covered by a circuit board. An insert of plastic is arranged in the housing. The insert forms on its side which faces the circuit board a plurality of cells each of which has a meander shaped flow path. The cooling agent is conducted through this flow path. Cells at left and right edges of the circuit board are larger than cells in the middle so that the cooling effect of the cooling agent is here not so large.

U.S. Pat. No. 6,388,317 B1 shows a cooling device for a power semiconductor in which the power semiconductor is assembled onto the upper side of a heat conducting plate. The heat conducting plate on its side covers a micro-canal arranged below the power semiconductor in a cooling body. If one uses several power semiconductors, several cooling bodies spaced from one another must be provided on a carrier. If still more power semiconductors are needed, one can arrange several carriers next to one another on a base.

U.S. Pat. No. 5,978,220 shows a further cooling device for a power semiconductor arrangement, in which the power semiconductors are arranged on a housing, which encloses a cooling chamber, through which a cooling agent flows. Below each power semiconductor, heat conducting pins extend into the chamber so that the heat from the power semiconductors can be better transferred to the cooling agent.

Power semiconductors in operation create a certain heat, due to energy losses, which must be led away in order to not thermally overload the power semiconductors. By means of the above discussed procedures, the thermal loading of the power semiconductors can be reduced in sufficient degree that a thermal damage is still only to be seen in infrequent cases, but it has also been established that such power semiconductors modules, in the long run, do not work as reliably as is desired.

SUMMARY OF THE INVENTION

The invention has as its object the lowering of the risk of failure of a power semiconductor module.

This object is solved for a power semiconductor module of the previously mentioned kind in that an uncooled region is arranged between at least two cells.

With this construction, indeed, the effect of the cooling power of the cooling agent on the power semiconductor module is diminished. Therefore it is not in itself to be expected that the risk of failure will be diminished through such a procedure. In fact, this procedure leads to a slight increase in the average temperature of the power semiconductor module. The large advantage is that the temperature distribution becomes more uniform. In other words, the temperature difference between the hottest and the coldest spots of the circuit board is reduced. Thereby mechanical stresses, which can arise because of the temperature differences are also reduced. With such mechanical stresses, there exists the risk that electric conductors formed on the power semiconductor module may be damaged. These electrical conductors can, for example, be formed by conductor paths which are printed onto the first side of the circuit board or that can be applied in some other way. If temperatures appear here whose difference exceed a predetermined value, then this can lead to such a conductor path being loosened from the circuit board and eventually breaking. Similar dangers also exist in the case of solder connections, which, in the case of unfavorable thermo-mechanical demands, can no longer work with sufficient reliability. Even if a complete conductor breaking does not always appear here, the effective conductor cross-section can still be so reduced that the normal functionality of the power conductor module is no longer assured. With the procedure according to the invention, one now does not directly take away heat by way of a cooling agent where no heat is created. The heat dissipation is limited much more, so to say, "point-wise" to the places at which the heat is produced. These are the places where the power semiconductors are mounted on the circuit board. The heat created there streams naturally into neighboring areas and leads to a temperature increase in the uncooled regions. Since the uncooled regions are neighbored by cooled regions where heat is created, this, in accordance with the invention, leads to a certain temperature uniformity between cooled and uncooled regions. The lowering of temperature differences associated therewith leads to a corresponding reduction of mechanical stresses, and thereby, to a higher reliability in the operation of the power semiconductor modules and to a longer operating life. The cooling can then directly take place; that is, the cooling agent can directly operate on the circuit board. It can also take place indirectly if the circuit board is arranged on a substrate, a so-called "base plate". In this case, the cooling agent operates on the substrate and conducts heat away through the substrate.

Preferably, the uncooled region has a surface extent which corresponds to $1/10$ to 10 times the surface extent of a cell neighboring the uncooled region. This statement is to be understood to mean that along a given direction; that is, between neighboring cells, there appear uncooled regions whose lengths correspond to $1/10$ to 10 times the length of the cells in this direction. One, therefore, alternates cells and uncooled regions having sizes of somewhat the same size order. Thereby relatively uniform temperatures are maintained in the circuit board.

Preferably, a full path is arranged in each cell for the cooling agent, which path effects multiple direction changes in the cooling agent as it flows through the cell. Thereby a turbulent flow is achieved, which improves the heat transfer from the substrate to the cooling agent. Simply stated, practically each volumetric element of the cooling agent has a chance to come into contact with the substrate. Heat conduction within the cooling agent is, therefore, only required to a limited degree.

It is also of advantage if the flow path has a cross-section in the range of from 1 to 6 mm$^2$. Also in this case one can create a turbulent flow. Thus, it is assured that cooling agent in sufficient amount can flow through the cells.

Preferably, each of two neighboring cells is bordered by a wall which is separate from the wall of the neighboring cell. In this way, it is assured that between two individual cells an uncooled region, that is, a region not impacted by the cooling agent, actually exists. Physically, this can be simply accomplished in that each cell is surrounded by a wall. Each of the cells therefore, for example, forms its own elevation on a carrier.

Preferably, a substrate has a recess for at least one cell, which recess receives the cell. One can then insert the described elevation into the substrate. The substrate then exists between the cells and is not impacted by the cooling agent.

Preferably, the cells are formed on one side of a carrier made of non-heat conducting material and the cooling agent is delivered to the other side of the carrier, so that the carrier in the uncooled regions of the conductor plate is thermally insulated from the cooling agent. The notion of the thermal insulation is to be understood as functional here. In practice, one cannot avoid that a certain amount of heat flow also flows through the carrier. One hinders, however, the cooling agent advancing directly to the substrate or to the circuit board and there absorbing heat. The carrier, therefore, also helps to make uniform the temperature of the substrate.

Preferably, the cooling agent in the case of at least one cell creates a uniform temperature on the first side of the circuit board. One, therefore, conducts the cooling agent such that a temperature plateau is achieved in which a uniform temperature prevails. Depending on the heat created by the power semiconductor, this can mean that at certain spots the cooling agent flows with a larger volume, or at a greater speed, through the cells.

Preferably, various cells are arranged according to the course of isothermals of the uncooled modules. Therefore, one first determines the isothermals of the uncooled modules. These isothermals can be determined by measurement. However, they can also be predetermined numerically or analytically. If the cells are now arranged so that each of them distinctly strongly cools a region bordered by isothermals, then an extraordinarily uniform temperature distribution results. Certain temperature differences are, indeed, not removed. These, however, are quite permissible so long as they do not exceed a predetermined value.

Preferably, the cooling agent vaporizes in the cooling process. One can, indeed, use gaseous or liquid cooling agents. However, when a cooling agent is chosen whose vaporization temperature lies in the range of the temperature created by the power semiconductors, then by way of the vaporization an especially large amount of heat can be taken away.

Preferably, neighboring cells have oppositely running cooling agent paths. In other words, the cooling agent inputs of neighboring cells, for example, are likewise neighboring, that is, are located on sides of the cells facing one another.

With this arrangement, it is possible to still further improve the uniformity of the temperature distribution.

The object of the invention, in the case of a method of the previously mentioned kind, is solved in that a temperature distribution of the uncooled power semiconductor module is determined and areas with a temperature below a predetermine temperature value of the temperature distribution are removed from being impacted by the cooling agent.

The temperature distribution can be determined, as carried out above, by the measurement of an uncooled power semiconductor module. One can, however, also calculate it, for example, by the use of finite element processes or by finite difference processes. Also an analytical calculation may be possible. The temperature distribution is the result of a heat delivery and a heat removal. One now displaces the center of gravity of the heat removal and allows areas, in which a heat delivery does not occur, to be uncooled. Then, in these regions a certain temperature increase will indeed occur because even the uncooled regions will be effected by the heat sources, for example, by heat radiation or heat conduction. A certain temperature increase of the power semiconductor module as a whole is however, acceptable, if one, at the same time, can reduce the temperature differences throughout the module.

Preferably, isothermals are determined and the impacting of the cooling agent is arranged along the isothermals. Isothermals are curves of identical temperature. Then one can, for example, more strongly cool an area which is enclosed by a curve indicating a higher temperature, that is, impact that area with more cooling agent, then is the case for an area surrounded by a curve representing a lower temperature. Naturally, the impacting with cooling agent need not be exactly arranged on such isothermals. The isothermals, however, give a good indication of where an increased impacting with cooling agent is of value and of where to avoid an impacting with the cooling agent, in order to achieve a uniform temperature throughout the substrate.

Preferably, for the impacting one also uses a turbulent flow of the cooling agent. This improves the heat removal even if a heat conduction within the cooling agent does not exist or exists only to a limited degree.

Preferably, the cooling agent is conducted through cells which are spaced from one another. This is a relatively simple construction for removing the cooling from, that is, from being impacted by the cooling agent, distinct regions of the circuit board and/or of the substrate.

It is also of advantage if the cooling agent is conducted in oppositely running paths through cells which neighbor one another. In regions to which the cooling agent is supplied an increased cooling effect is created, which, in general, is combined with a somewhat stronger temperature reduction. In this way, the fact that the temperature gradients can be held small is achieved.

BRIEF DESCRIPTION OF THE DRAWINGS

The invention is described in the following by way of preferred embodiments in combination with the drawings. The drawings show.

DETAILED DESCRIPTION OF THE INVENTION

Figure 1A:
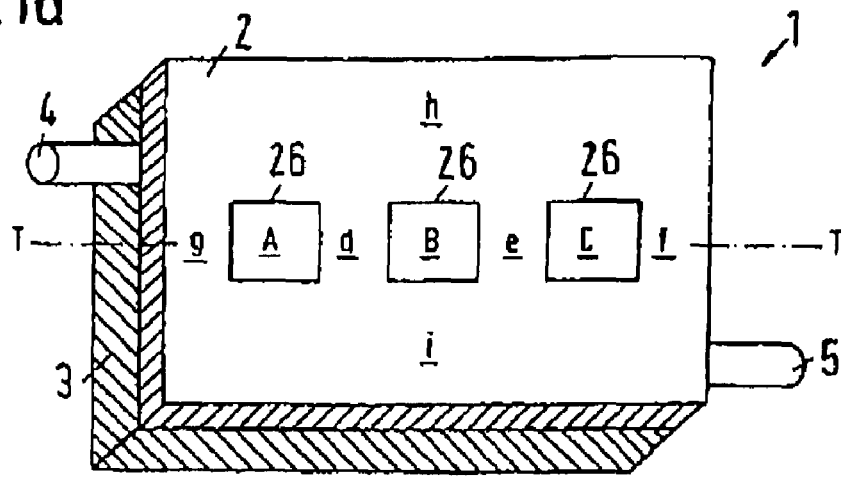
FIG. 1*a* is a schematic illustration of a power semiconductor module.

FIG. 1a shows a power semiconductor module 1 with three power semiconductors A, B, C, which are connected with electric conductors not shown in more detail.

The power semiconductors A-C are each arranged on a circuit board 26. The circuit board can, for example, be formed as a DCB-Substrate (Direct Copper Bonding-Substrate, for example, copper-ceramic-copper). Other constructions for the circuit board are possible. In general, such a circuit board is heat conducting only to a limited degree. Overall, the heat, which is produced by the power semiconductors A-C as lost energy, penetrates through the circuit board. The circuit board 26 in turn is applied to a substrate 2. The substrate 2, typically referred to as the "base plate," in general consists of copper and is, therefore, a good heat conductor.

The substrate 2 is arranged on a cooling device 3 having a cooling agent input 4 and a cooling agent outlet 5. The cooling agent can, therefore, (with reference to the illustration of FIG. 1a) flow through the cooling device 3 from left to right.

Figure 1B:
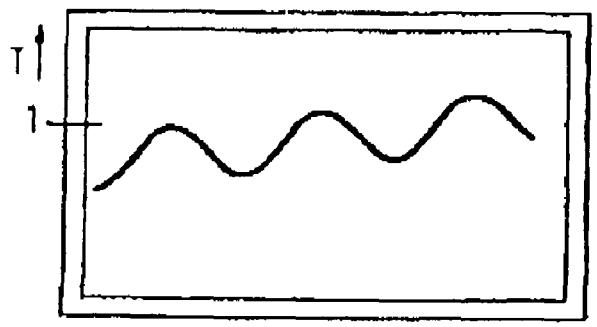
FIG. 1*b* is a temperature course along a line T-T according to FIG. 1 without further measure.

In operation, each power semiconductor creates, as mentioned above, a certain energy loss which is given off in the form of heat and which leads to a temperature increase. Since a certain portion of the heat is taken away by the cooling agent there results without further measures at the substrate 2 a temperature course such as illustrated in FIG. 1b. The temperature T is here taken to increase upwardly. At the places where the power semiconductor A-C are arranged there results a corresponding temperature maximum. The average temperature increases in going from the cooling agent input 4 to the cooling agent output 5 because each power semiconductor A-C increases the temperature of the cooling agent.

Figure 2:
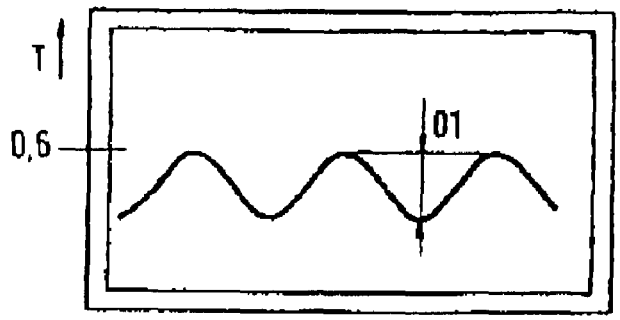
FIG. 2 is the temperature course according to FIG. 1*b* with the use of an arrangement according to WO 03/095922 A2.

If one now uses a cooling device such as known for example from WO 03/095922 A2 then there results a course such as illustrated schematically in FIG. 2. Even here, in the region of each power semiconductor A-C, a maximum temperature is observed. Between each pair of power semiconductors the temperature course has a minimum. Between the maximum and minimum temperatures there results a temperature difference D1. This temperature difference is larger than the corresponding temperature difference in Fig. 1b. Overall, the temperature is entirely lower so that the thermal demand of the power semiconductors A-C remains smaller.

Figure 3:
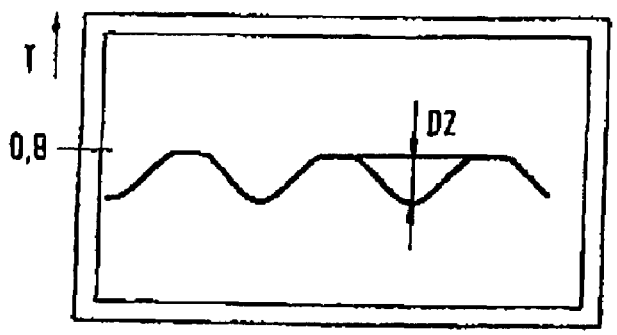
FIG. 3 is the temperature course according to the present invention.

FIG. 3 now shows the corresponding temperature course which is achieved with the procedure explained in more detail below. Between the maximum and the minimum of the temperature there results a difference D2 which is essentially smaller than the temperature difference D1 of FIG. 2. Moreover, it is seen that no distinct maximum of the temperature curve appears and instead the temperature curve in the regions of its highest values has plateaus.

The illustrations in FIGS. 1b, 2 and 3 are not to scale and serve only for explanation. If one sets the temperature level of the first maximum of the temperature curve of FIG. 1b to the value 1 (100%), then the temperature level of the first maximum of the temperature curve of FIG. 2 lies at the value 0.6 (60%); and the temperature level of the maximums of the curve according to FIG. 3 lies at the value of 0.8 (80%). The procedure according to the invention, therefore, gives in total a temperature increase, which, however, is tolerable because the temperature difference D2 is relatively smaller than the temperature difference D1. The value of D2 is, for example, only 20-30% of the value of D1.

Figure 4:
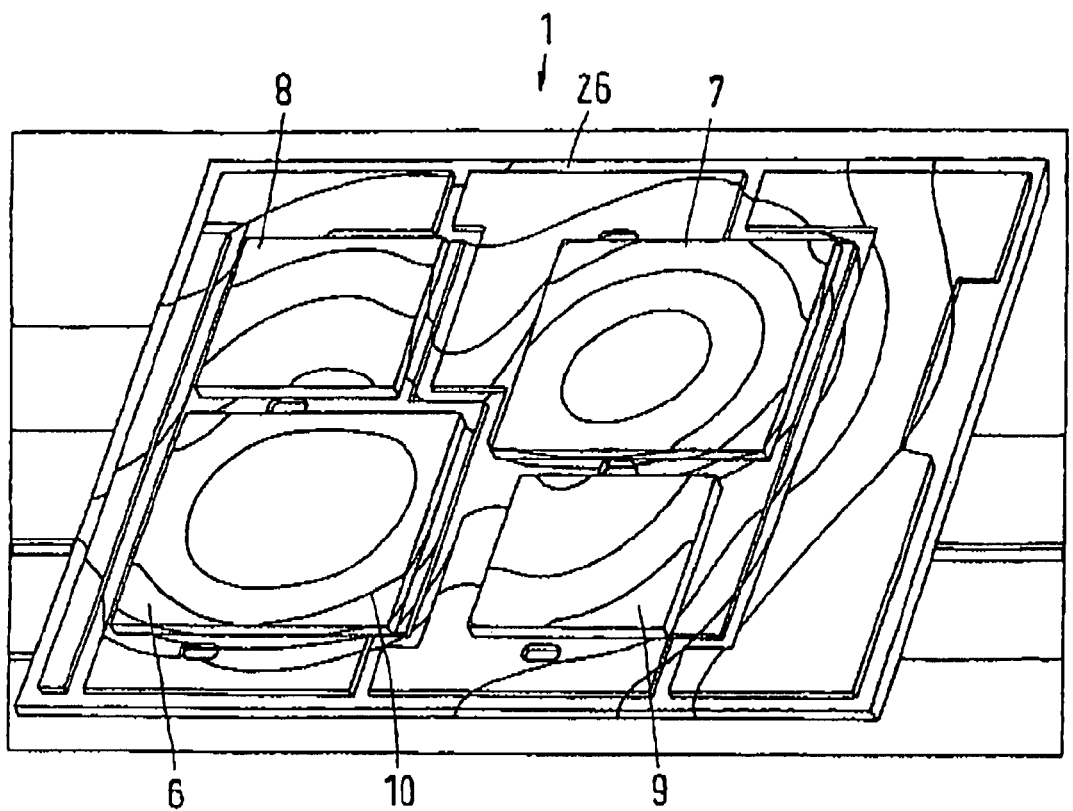
FIG. 4 is the course of isothermals in the case of a circuit board with power semiconductors with customary cooling.

FIG. 4 shows another circuit board 26 with two IGBTs (Integrated Gate Bipolar Transistors) 6, 7 and two diodes 8,9. Illustrated are isothermal lines resulting from a cooling according to WO 03/095922 A1 or a corresponding cooling. It is seen that the isothermal lines lie relatively closely to one another. This corresponds to a relatively steep temperature gradient, that is, the difference between the highest occurring temperatures and the lowest occurring temperatures is relatively large. It amounts to, for example, 10K.

Figure 5:
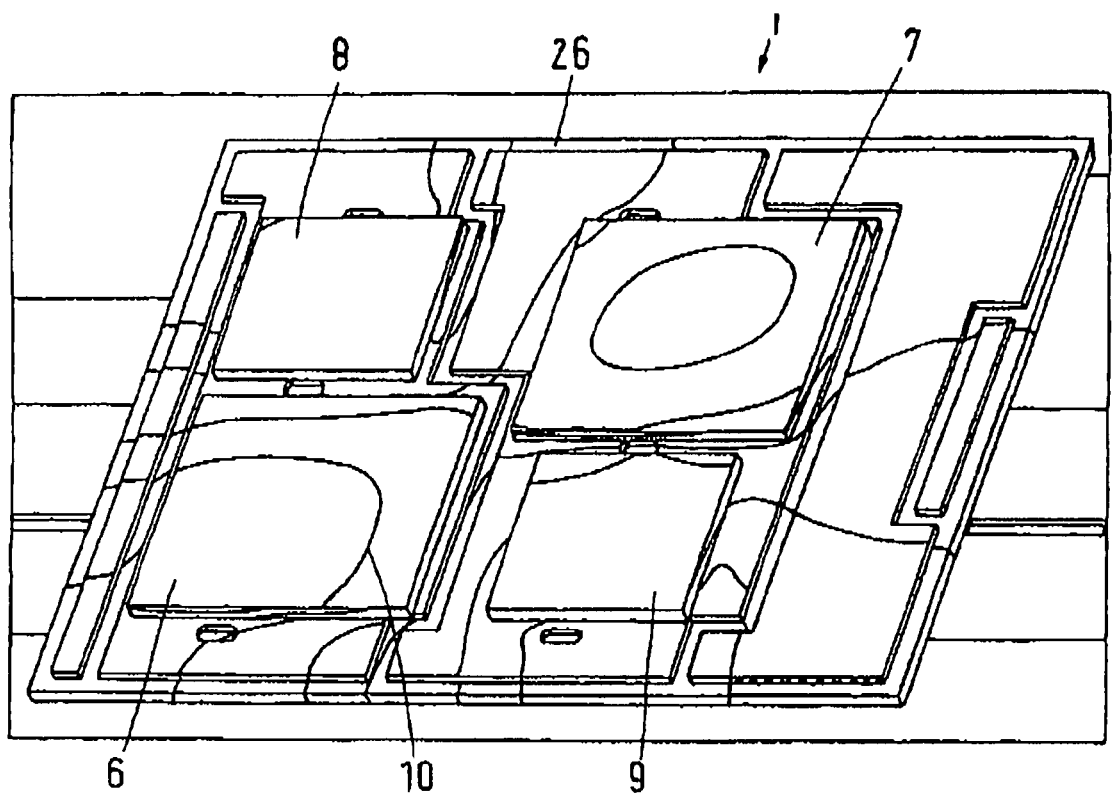
FIG. 5 is the course of the isothermals in the circuit board of FIG. 4 and according to the present invention.

FIG. 5 shows the same arrangement with isothermal lines in the case of using the cooling described in the following. Without anything further, it is seen that the isothermal lines 10 have a central larger spacing from one another. Accordingly the temperature difference sinks over the circuit board, for example to 3K in the region of the power semiconductors, that is in a region of the IGBTs 6, 7, and to 2K in the region of the diodes 8, 9. Thus, the temperature difference over the substrate 2 is thereby lowered.

This achieved in that a cooling by the cooling agent is undertaken only directly in the regions of the power semiconductors A, B, C. Between the power semiconductors A-C and around the power semiconductors there remain areas d, e, f, g, h, i, in which the stressing of the substrate 2 with the cooling agent does not occur. Also in the regions of the circuit board between the power semiconductors 6 and 8 are provided regions which are not cooled. In these regions it is accordingly hindered that the created heat can be directly transferred to the cooling agent. As has been explained in connection with FIG. 3, this leads to the fact that the temperature of the substrate 2 and of the circuit board 26 indeed increases in the middle. This temperature increase is however not critical, because the allowable operating temperature of the power semiconductors A-C is not exceeded. However, the temperature difference between the "hot" and "cold" regions is considerably reduced. This reduction of the thermal difference leads to a distinct lowering of mechanical stresses. The lowering of the mechanical stresses in turn diminishes the risk that mechanical damage will occur to the conductors or the like, which are arranged on the circuit board 26 and serve to supply the power conductor A-C or to conduct currents and voltages which are controlled by the power semiconductors A-C.

Figure 6:
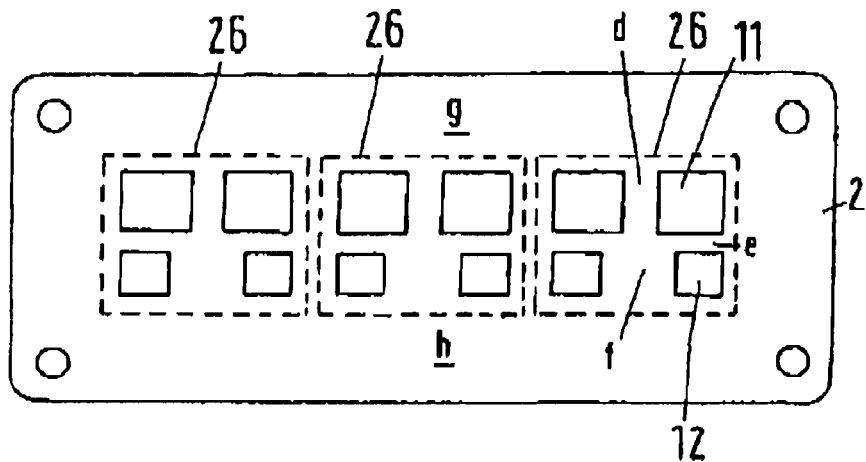
FIG. 6 is a schematic illustration of a substrate.
Figure 7:
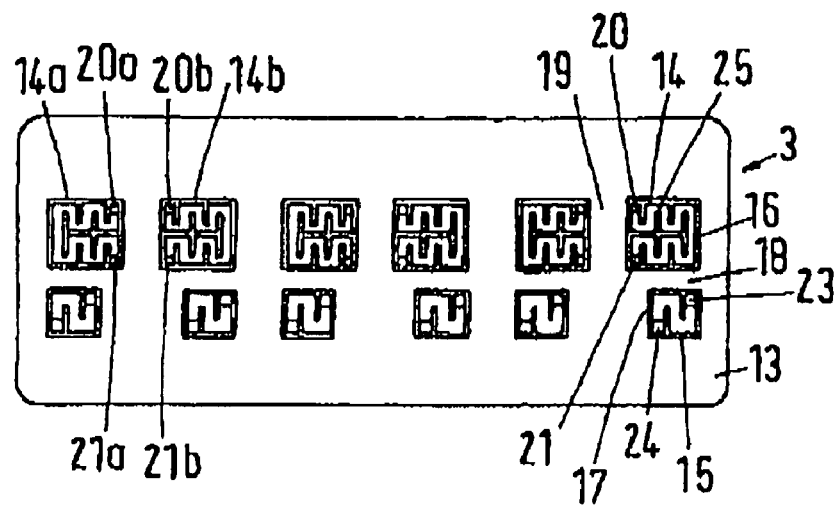
FIG. 7 is a plan view of a cooling device.
Figure 8:
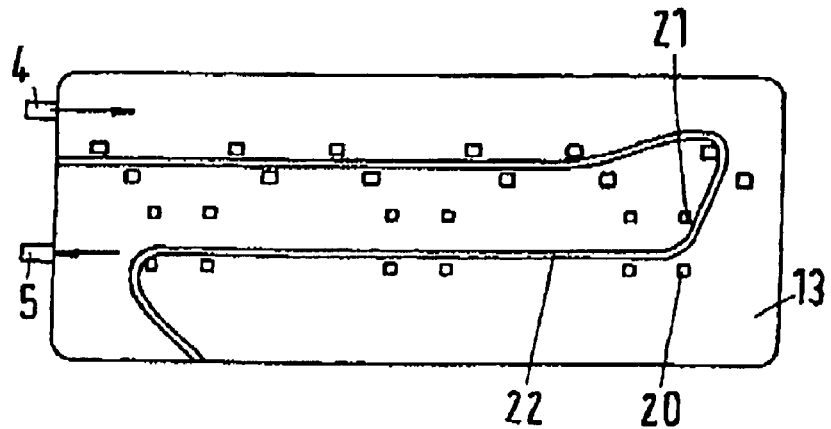
FIG. 8 is a view of the underside of the cooling device of the FIG. 7.

FIGS. 6 to 8 show a practical embodiment of the invention. FIG. 6 shows the substrate 2 from above. Illustrated by dashed lines are the circuit boards 26 which are arranged on the other side of the substrate 2. Regions 11 and 12 are only schematically illustrated. There are located the IGBTs 6, 7 and the diodes 8,9. Naturally, other arrangements are also possible as, for example, shown in FIGS. 4 and 5. Illustrated is a substrate for a power semiconductor module which is to constitute a three-phase alternating current rectifier, in the case of which for each phase two IGBTs and the two diodes are provided. Therefore a total of three circuit boards 26 are arranged on the substrate 2.

In the regions 11, 12, the substrate has either through-going openings, or the substrate 2 has in these regions 11, 12 recesses, which are almost through-going, so that the regions 11, 12 are still covered by a layer. In this case cooling agent which is delivered from above is delivered into the recesses and does not come into direct contact with the corresponding side of the circuit boards 26, which are mounted on the substrate 2.

FIG. 7 now shows a cooling device 3 in plan view. The cooling device 3 has a carrier 13 of plastic. The plastic is poorly heat conducting, that is, it forms a kind of thermal insulator. On the carrier 13 are arranged a number of cells 14, 15. Each cell is surrounded by a wall 16, 17 standing perpendicularly on the carrier 13, with the walls of neighboring cells 14, 15 being separated by an intermediate space 18, 19.

If one now uses a carrier 13 on the underside of the substrate 2 (this side is not shown in FIG. 6) then the walls 16,17 fit exactly into the recesses of the regions 11,12 so that a cooling agent which is located in the cells 14,15 and which flows through these cells only contact the regions 11, 12 and not the regions d, e, f, lying there between or other outwardly lying regions g, h.

Each cell 14 has an inlet 20 and an outlet 21. Inlet 20 and outlet 21 extend through the carrier 13. On the underside of the carrier 13 they are separated from one another by a wall 22, so that the cooling agent inlet 4 and the cooling agent outlet 5 can be arranged on the underside of the carrier 13.

In similar fashion, the cells 15 each have an inlet 23 and an outlet 24.

The cells 14 have a wall structure 25 which is so formed that in flowing from the inlet 20 to the outlet 21 the cooling agent must flow through a number of curves. The wall structure therefore forms a kind of meander. Already, this measure serves to make the flow between the inlet 20 and the outlet 21 turbulent. Moreover, the cross section of the flow is here relatively large. It lies, for example, in the size range of from 1 to 6 mm$^2$. This also contributes to the flow being turbulent.

In the case of two cells 14a, 14b neighboring one another the inlets 20a, 20b lie opposite to each other. The same is true for the outlets 21a, 21b. This has the result that the cells 14a, 14b are flowed through in opposite direction so that the temperature can be held to be small. Where the two cells 14a, 14b have their smallest spacing to one another the cooling agent has essentially the same temperature.

In the exemplary embodiment of FIGS. 6 to 8 there is practically one cell 14, 15 for each power semiconductor. One can, however, still go further and make the cells smaller so that they form a kind of "quantum cell". One can then arrange these quantum cells on the isothermal lines, which for example are shown in FIGS. 4 and 5, and thereby see to it that the hotter areas are more strongly cooled than the not-so-hot areas. If one additionally sees to it that one removes regions from the encounter with cooling agent, so that these regions are therefore not so well cooled, then one achieves a very uniform temperature distribution at the substrate.

Even in such a case, one can use a carrier 13 onto which the individual cells 14, 15 are arranged. The carrier 13 then inhibits not only the encounter of the substrate with the cooling agent at the not cooled regions, but also hinders a larger heat flow from the substrate to the cooling agent.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A power semiconductor module with various power semiconductors fastened to a first side of a circuit board and a cooling device on a second side of the circuit board which lies oppositely to the first side, and which cooling device works with a cooling agent, with the cooling device having various cells through which the cooling agent is guided, wherein between at least two cells an uncooled region is arranged.

2. The power semiconductor module according to claim 1, wherein the uncooled region has a surface extent which corresponds to $\frac{1}{10}$ to 10 times the surface extent of one of the regions of the neighboring cells.

3. The power semiconductor module according to claim 1, wherein in each cell is arranged a flow path for the cooling agent which path effects a plurality of direction changes of the cooling agent during its flow through the cell.

4. The power semiconductor module according to claim 3, wherein the flow path has a cross-sectional area in the range of 1 to 6 mm$^2$.

5. The power semiconductor module according to claim 1, wherein at least two neighboring cells are each surrounded by a wall which wall is separate from the wall of the neighboring cell.

6. The power semiconductor module according to claim 1, wherein a substrate for at least one cell has a recess which receives the cell.

7. The power semiconductor module according to claim 1, wherein the cells are formed on one side of a carrier made of non-heat conducting material and that the cooling agent is delivered to the other side of the carrier with the carrier in the uncooled regions of the circuit board thermally insulating the uncooled regions from the cooling agent.

8. The power semiconductor module according to claim 1, wherein with at least one cell the cooling agent creates a uniform temperature on the first side of the circuit board.

9. The power semiconductor module according to claim 1, wherein various cells are arranged according to the path of isothermals of the uncooled module.

10. The power semiconductor module according to claim 1, wherein the cooling agent evaporates in the cooling process.

11. The power semiconductor module according to claim 1, wherein neighboring cells have oppositly running cooling agent paths.

12. A method for cooling a power semiconductor module which on a first side of a circuit board has various power semiconductors, wherein a cooling agent is allowed to work on a second side of the circuit board opposite to the first side, characterized in that a temperature distribution of the uncooled power semiconductor module is determined and areas with a temperature below a predetermined temperature value obtained from the temperature distribution are excluded from being impacted by the cooling agent.

13. The method according to claim 12, wherein isothermals are determined and the impacting by the cooling agent is arranged along the isothermals.

14. The method according to claim 12, wherein for the impacting of the second side of the circuit board by the cooling agent a turbulent flow of the cooling agent is used.

15. The method according to claim 12, wherein the cooling agent is conducted through cells spaced from one another.

16. The method according to claim 15, wherein the cooling agent is conducted to two neighboring cells so that in each of those two cells the cooling agent runs oppositely to the running of the cooling agent in the other of the two neighboring cells.

* * * * *